United States Patent
Nakatogawa

(10) Patent No.: US 12,532,637 B2
(45) Date of Patent: Jan. 20, 2026

(54) ELECTRONIC APPARATUS AND DISPLAY DEVICE

(71) Applicant: Magnolia White Corporation, Tokyo (JP)

(72) Inventor: Hirondo Nakatogawa, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 513 days.

(21) Appl. No.: 18/115,843

(22) Filed: Mar. 1, 2023

(65) Prior Publication Data

US 2023/0284508 A1   Sep. 7, 2023

(30) Foreign Application Priority Data

Mar. 2, 2022  (JP) .................... 2022-031627

(51) Int. Cl.
*H10K 59/65* (2023.01)
*H04M 1/02* (2006.01)
*H10K 59/35* (2023.01)
*H10K 59/80* (2023.01)

(52) U.S. Cl.
CPC .......... *H10K 59/65* (2023.02); *H04M 1/0264* (2013.01); *H10K 59/351* (2023.02); *H10K 59/353* (2023.02); *H10K 59/878* (2023.02)

(58) Field of Classification Search
CPC .... H10K 59/65; H10K 59/351; H10K 59/353; H10K 59/878; H10K 59/121; H04M 1/0264; H04M 1/0266
See application file for complete search history.

(56) References Cited

U.S. PATENT DOCUMENTS

2006/0221092 A1   10/2006  Noguchi et al.

FOREIGN PATENT DOCUMENTS

JP    2009-065498 A    3/2009

*Primary Examiner* — Donald L Raleigh
(74) *Attorney, Agent, or Firm* — Michael Best & Friedrich LLP

(57) ABSTRACT

According to one embodiment, an electronic apparatus includes a display panel in which a first pixel including a first light emitting element configured to emit light of a first color, a second pixel including a second light emitting element configured to emit light of a second color, and a third pixel including a third light emitting element configured to emit light of a third color are arranged, and an imaging element configured to receive light via the display panel. The first to third pixels are disposed at positions overlapping the imaging element. The display panel includes a reflective layer that is not formed at a position facing the first light emitting element, and is formed at positions facing the second and third light emitting elements.

12 Claims, 10 Drawing Sheets

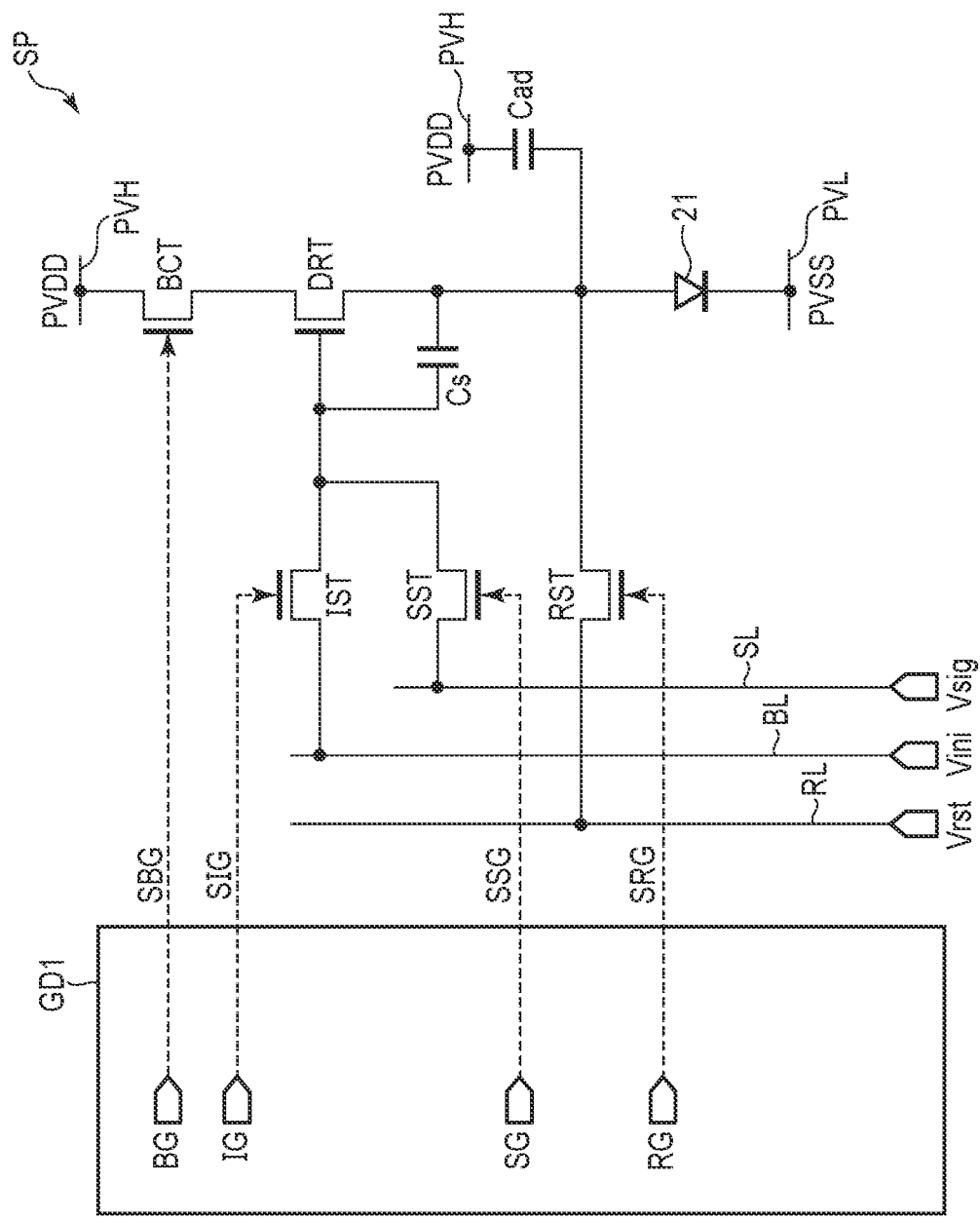
F I G. 4

ELECTRONIC APPARATUS AND DISPLAY DEVICE

CROSS-REFERENCE TO RELATED APPLICATIONS

This application is based upon and claims the benefit of priority from Japanese Patent Application No. 2022-031627, filed Mar. 2, 2022, the entire contents of which are incorporated herein by reference.

FIELD

Embodiments described herein relate generally to an electronic apparatus and a display device.

BACKGROUND

In recent years, electronic apparatuses such as smartphones each including a display device and a camera on the same surface side have widely been in practical use. In addition, as a display device provided in such an electronic apparatus, a display device having an organic electroluminescence (EL) element (hereinafter referred to as an organic EL display device) may be adopted.

In the electronic apparatus described above, a camera is disposed on a back surface of the organic EL display device (display region), and an imaging element included in the camera is configured to receive light via the organic EL display device, so that the display region can be enlarged to a region overlapping the camera.

Incidentally, in the organic EL display device, various screens can be displayed by causing the organic EL element included in each pixel to emit light, but sufficient luminance may not be realized in a pixel disposed at a position overlapping the camera (imaging element) described above.

BRIEF DESCRIPTION OF THE DRAWINGS

FIG. 4 is a circuit diagram illustrating an example of a circuit configuration of a sub-pixel.

DETAILED DESCRIPTION

Figure 1:
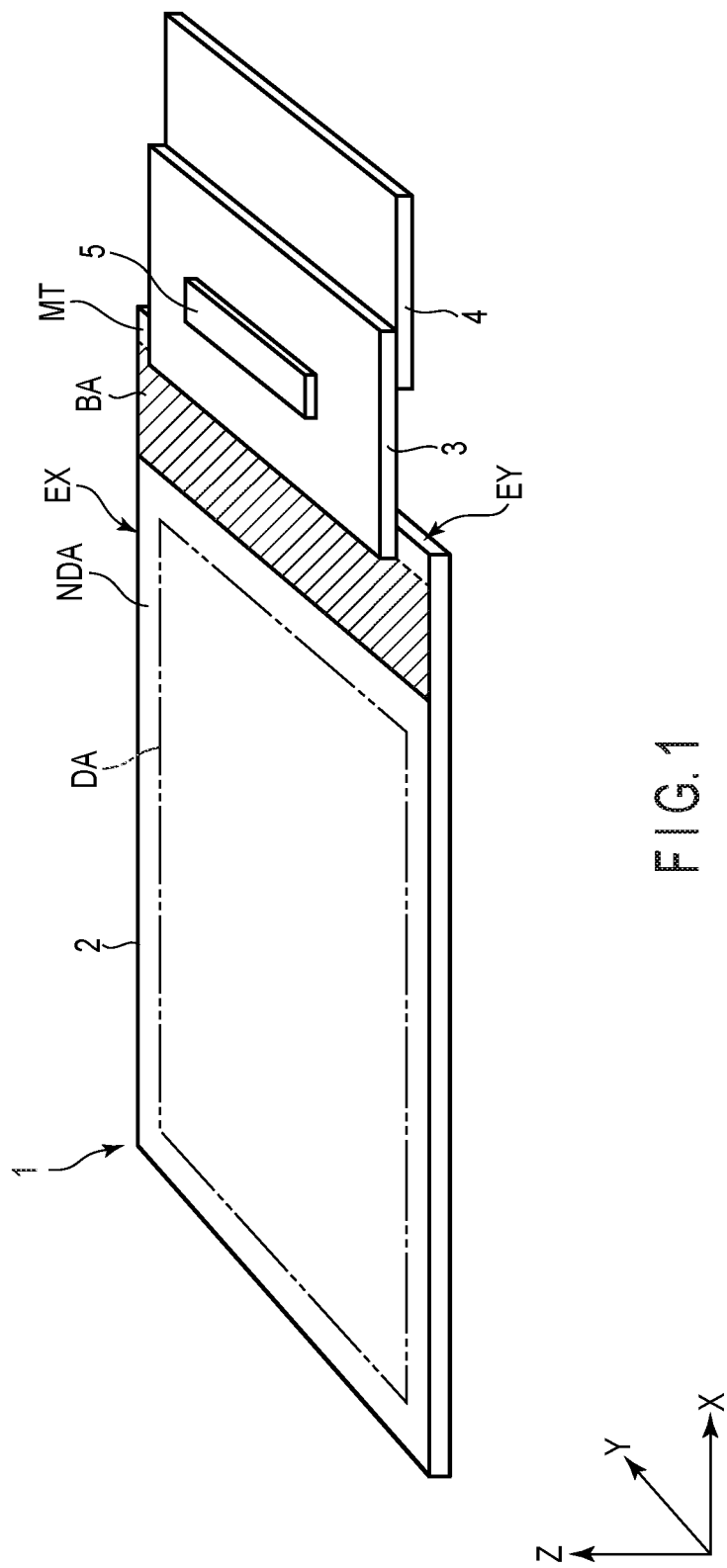
FIG. 1 is a perspective view schematically illustrating a configuration of a display device according to a first embodiment.

In general, according to one embodiment, an electronic apparatus includes a display panel in which a first pixel including a first light emitting element configured to emit light of a first color, a second pixel including a second light emitting element configured to emit light of a second color, and a third pixel including a third light emitting element configured to emit light of a third color are arranged, and an imaging element configured to receive light via the display panel. The first to third pixels are disposed at positions overlapping the imaging element in planar view. The display panel includes a reflective layer that is not formed at a position facing the first light emitting element, and is formed at positions facing the second and third light emitting elements.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

First Embodiment

The first embodiment will now be described. FIG. 1 is a perspective view schematically showing a configuration of a display device according to the first embodiment. FIG. 1 illustrates a three-dimensional space defined by a first direction X, a second direction Y perpendicular to the first direction X and a third direction Z perpendicular to the first direction X and the second direction Y. Note that the first direction X, the second direction Y and the third direction Z are orthogonal to each other, but may intersect at an angle other than ninety degrees. In the following descriptions, the third direction Z is defined as "upward" and a direction opposite to the third direction is defined as "downward". Further, with such expressions "a second member above a first member" and "a second member below a first member", the second member may be in contact with the first member or may be remote from the first member.

Hereinafter, in the present embodiment, a case where the display device 1 is an organic electroluminescence (EL) display device (an organic EL display) having an organic EL element which is a spontaneous light-emitting element will be described. Incidentally, the display device 1 according to the present embodiment is used in an incorporated state in an electronic apparatus such as a smartphone together with another device such as a camera.

As shown in FIG. 1, the display device 1 includes a display panel 2, a first circuit board 3, and a second circuit board 4.

For example, the display panel 2 has a rectangular shape. In the example illustrated, a long side EX of the display panel 2 is parallel to a first direction X, and a short side EY of the display panel 2 is parallel to a second direction Y. A third direction Z corresponds to a thickness direction of the display panel 2. A main surface of the display panel 2 is parallel to an X-Y plane defined by the first direction X and the second direction Y. The display panel 2 includes a display region DA, a non-display region NDA outside the display region DA, and a terminal region MT. In the example illustrated, the non-display region NDA surrounds the display region DA.

The terminal region MT is provided along the short side EY of the display panel 2, and includes a terminal for electrically connecting the display panel 2 to an external device or the like.

The first circuit board 3 is mounted on the terminal region MT, and is electrically connected to the display panel 2. The first circuit board 3 is, for example, a flexible printed circuit board. The first circuit board 3 includes a driver IC chip (a drive circuit) 5 that drives the display panel 2 (the display device 1). Incidentally, in the example illustrated, the driver IC chip 5 is disposed on the first circuit board 3, but may be disposed under the first circuit board 3. The second circuit board 4 is, for example, a flexible printed circuit board. The second circuit board 4 is connected to the first circuit board 3, for example, under the first circuit board 3.

The driver IC chip 5 is connected to a control board (not shown), for example, via the second circuit board 4. The driver IC chip 5 performs control to display an image on the display panel 2 by causing the organic EL element of the display panel 2 to emit light, for example, based on image data (a pixel signal) output from the control board.

Incidentally, the display panel 2 may have a fold region BA indicated by hatching in FIG. 1. The fold region BA is a region that is folded when the display device 1 is housed in a housing of an electronic apparatus. In a state where the fold region BA is folded, the first circuit board 3 and the second circuit board 4 are disposed under the display panel 2 to face the display panel 2.

Figure 2:
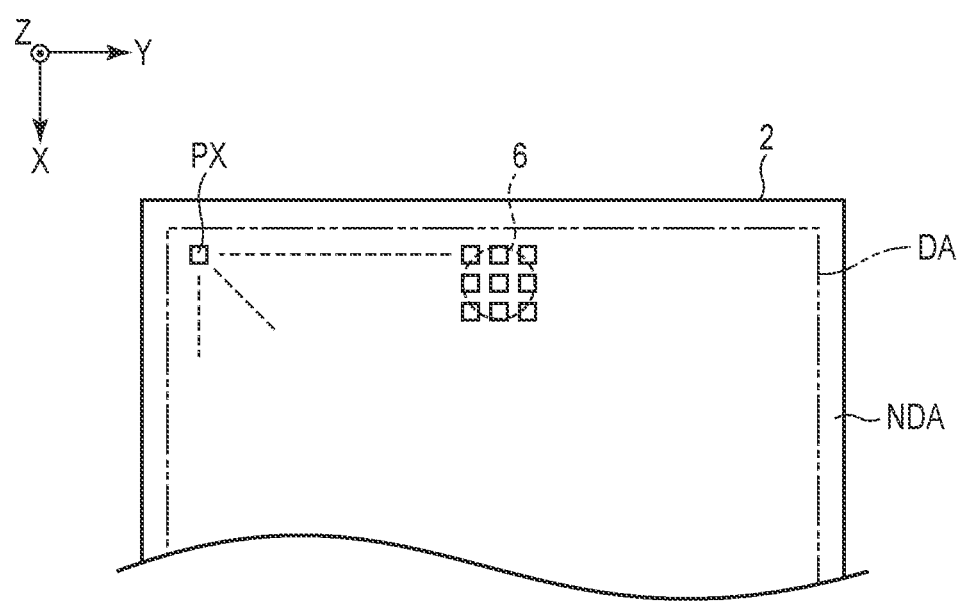
FIG. 2 is a plan view illustrating a partial portion of an electronic apparatus in which the display device is incorporated.

FIG. 2 is a plan view illustrating a partial portion of an electronic apparatus in which the display device 1 illustrated in FIG. 1 is incorporated. As shown in FIG. 2, the display panel 2 included in display device 1 includes a plurality of pixels PX arrayed (arranged) in a matrix in the first direction X and the second direction Y in the display region DA.

Incidentally, in the present embodiment, each pixel PX disposed in the display region DA includes an organic EL element to be described later and a pixel circuit for driving the organic EL element.

Here, in the present embodiment, the display panel 2 (the display device 1) has a display surface having the display region DA and a back surface opposite to the display surface, and a camera 6 having an imaging element that receives light via the display panel 2 is disposed on the back surface side of the display panel 2. The camera 6 in the present embodiment is assumed to be an imaging device (a visible light camera) that receives visible light through the imaging element and captures a color image. In the present embodiment, the display device 1 and the camera 6 constitute an electronic apparatus such as a smartphone.

Incidentally, in the electronic apparatus according to the present embodiment, the camera 6 is disposed at a position overlapping the display region DA. In other words, the camera 6 is disposed to straddle the plurality of pixels PX (that is, overlap the plurality of pixels PX) in planar view. According to such a configuration, the display region DA in the electronic apparatus (the display device 1) can expand to a region overlapping the camera 6. Incidentally, in the present embodiment, the planar view means that the display device 1 (the display panel 2) is visually recognized in the third direction Z.

Figure 3:
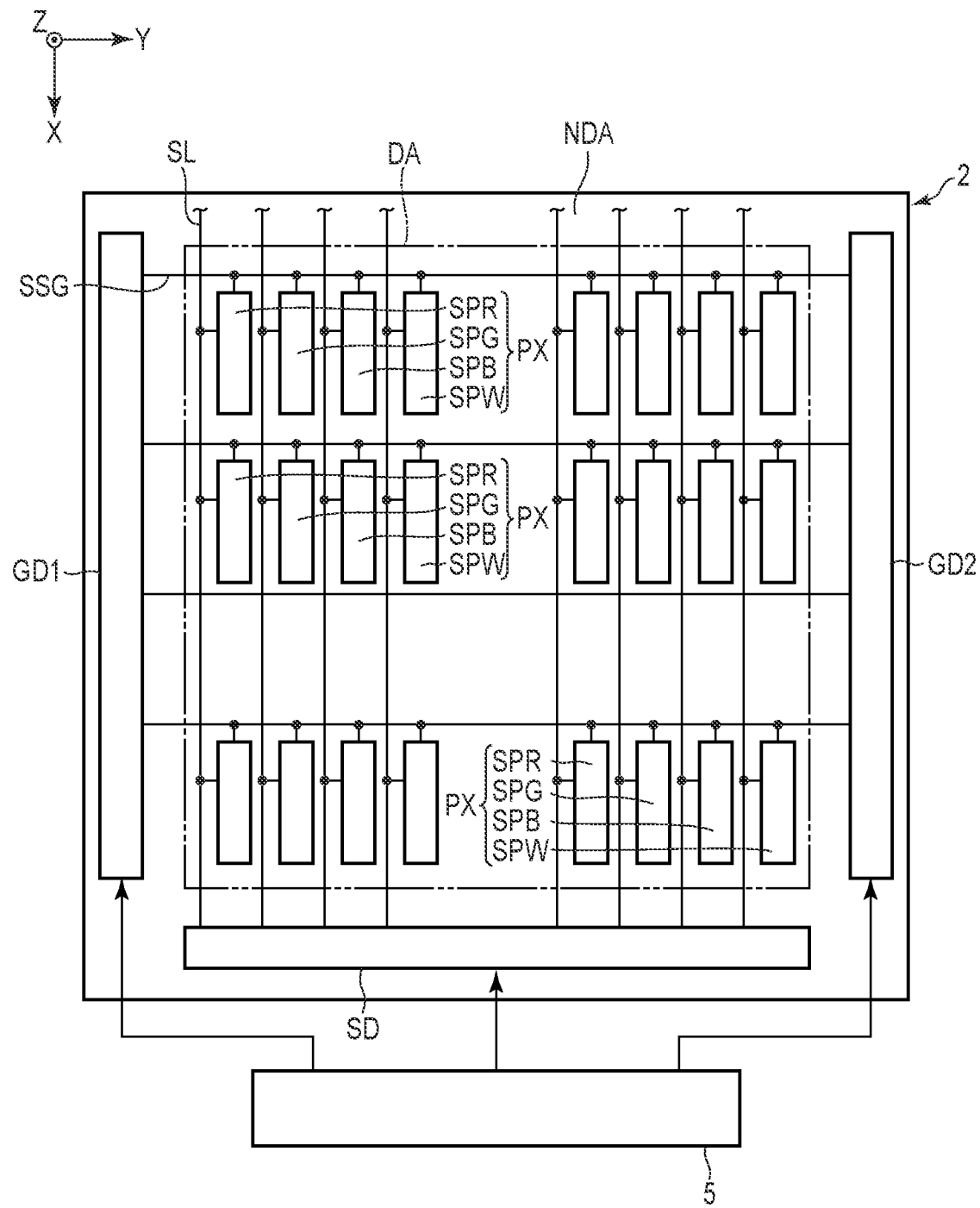
FIG. 3 is a diagram illustrating an example of a circuit configuration of a display panel.

FIG. 3 is a diagram illustrating an example of a circuit configuration of the display panel 2. A plurality of pixels PX, various wiring lines, scanning line drive circuits GD1 and GD2, and a signal line drive circuit SD are disposed in the display panel 2.

The plurality of pixels PX are arrayed in a matrix in the display region DA as described above, and each of the plurality of pixels PX includes a plurality of sub-pixels. In the present embodiment, the plurality of sub-pixels includes sub-pixels SPR, SPG, SPB, and SPW. The sub-pixel SPR is a red sub-pixel that displays (outputs) light corresponding to a red wavelength band (red component light). The sub-pixel SPG is a green sub-pixel that displays (outputs) light corresponding to a green wavelength band (green component light). The sub-pixel SPB is a blue sub-pixel that displays (outputs) light corresponding to a blue wavelength band (blue component light). The sub-pixel SPW is a white sub-pixel that displays (outputs) light corresponding to a white wavelength band (white component light).

The above-described various wiring lines extend in the display region DA and are drawn out to the non-display region NDA. In FIG. 3, a plurality of control wiring lines (scanning lines) SSG and a plurality of pixel signal lines SL are illustrated as some the various wiring lines.

In the display region DA, the control lines SSG and the pixel signal lines SL are connected to the sub-pixels SPR, SPG, SPB, and SPW. The control lines SSG are connected to the scanning line drive circuits GD1 and GD2 in the non-display region NDA. The pixel signal lines SL are connected to the signal line drive circuit SD in the non-display region NDA.

The scanning line drive circuits GD1 and GD2 and the signal line drive circuit SD are located in the non-display region NDA. Various signals and voltages are supplied from the driver IC chip 5 to the scanning line drive circuits GD1 and GD2 and the signal line drive circuit SD.

Incidentally, although it is illustrated in FIG. 3 that the display panel 2 includes two scanning line drive circuits GD1 and GD2, the display panel 2 only needs to include at least one scanning line drive circuit.

Next, an example of a circuit configuration of the sub-pixel included in the pixel PX will be described with reference to FIG. 4. Incidentally, in FIG. 4, a circuit configuration of one sub-pixel SP among the plurality of sub-pixels included in the pixel PX is illustrated for convenience.

As shown in FIG. 4, the sub-pixel SP includes an organic EL element 21 and a pixel circuit. The pixel circuit includes a drive transistor DRT, an output transistor BCT, a pixel transistor SST, an initializing transistor IST, a reset transistor RST, a storage capacitor Cs, and an auxiliary capacitor Cad.

Each transistor illustrated in FIG. 4 is, for example, an n-channel transistor. Incidentally, the output transistor BCT, the pixel transistor SST, the initializing transistor IST, and the reset transistor RST may not be constituted by transistors, and may be configured to function as, for example, an output switch, a pixel switch, an initializing switch, and a reset switch.

In the following description, one of a source electrode and a drain electrode of the transistor will be referred to as a first electrode, and the other one will be referred to as a second electrode. In addition, one electrode of the capacitive element will be referred to as a first electrode, and the other electrode will be referred to as a second electrode.

The drive transistor DRT and the organic EL element 21 are connected to each other in series between a first power line PVH and a second power line PVL. The first power line PVH is held at a constant potential, and the second power line PVL is held at a constant potential different from the potential of the first power line PVH. In the present embodiment, the potential PVDD of the first power line PVH is higher than the potential PVSS of the second power line PVL.

A first electrode of the drive transistor DRT is connected to an anode electrode (anode) of the organic EL element, a first electrode of the storage capacitor Cs, and a first electrode of the auxiliary capacitor Cad. A second electrode of the drive transistor DRT is connected to a first electrode of the output transistor BCT. The drive transistor DRT is configured to control a current (current value) supplied to the organic EL element 21.

A second electrode of the output transistor BCT is connected to the first power line PVH. In addition, a cathode electrode (cathode) of the organic EL element 21 is connected to the second power line PVL.

A first electrode of the pixel transistor SST is connected to a gate electrode of the drive transistor DRT, a first electrode of the initializing transistor IST, and a second electrode of the storage capacitor Cs. A second electrode of the pixel transistor SST is connected to the pixel signal line SL. A second electrode of the initializing transistor IST is connected to an initializing power line BL.

The storage capacitor Cs is electrically connected between the gate electrode and the first electrode of the drive transistor DRT.

A second electrode of the auxiliary capacitor Cad is held at a constant potential. In the present embodiment, the second electrode of the auxiliary capacitor Cad is connected to, for example, the first power line PVH, and is held at the same constant potential (PVDD) as the first power line PVH. Incidentally, the second electrode of the auxiliary capacitor Cad may be held at the same constant potential (PVSS) as the second power line PVL, or may be held at the same constant potential as a power line different from the first power line PVH and the second power line PVL. Incidentally, as a power line different from the first power line PVH and the second power line PVL, for example, the initializing power line BL, the reset power line RL, or the like can be used.

A first electrode of the reset transistor RST is connected to the first electrode of the drive transistor DRT. A second electrode of the reset transistor RST is connected to the reset power line RL.

A pixel signal Vsig is supplied to the pixel signal line SL. The pixel signal Vsig is a signal written into the pixel (here, the sub-pixel SP). An initializing potential Vini is supplied to the initializing power line BL.

The reset power line RL is set to a reset power potential Vrst. The reset power potential Vrst is a potential having a potential difference with respect to the potential PVSS of the second power line PVL such that the organic EL element 21 does not emit light.

A gate electrode of the output transistor BCT is connected to a control line SBG. An output control signal BG is supplied to the control line SBG.

A gate electrode of the pixel transistor SST is connected to the control line SSG. A pixel control signal SG is supplied to the control line SSG.

A gate electrode of the initializing transistor IST is connected to a control line SIG. An initialization control signal IG is supplied to the control line SIG.

A gate electrode of the reset transistor RST is connected to a control line SRG. A reset control signal RG is supplied to the control line SRG.

According to the circuit configuration as described above, the pixel transistor SST becomes conductive in response to the pixel control signal SG supplied to the gate electrode via the control line SSG. As a result, the pixel signal Vsig supplied via the pixel signal line SL is supplied to the gate electrode of the drive transistor DRT via the pixel transistor SST, and a voltage corresponding to Vsig is held in the storage capacitor Cs. The drive transistor DRT can cause the organic EL element 21 to emit light (drive the sub-pixel SP) by supplying a drive current having a current value corresponding to the voltage value stored in the storage capacitor Cs to the organic EL element 21.

Incidentally, although the outline of the operation of writing the pixel signal Vsig in the display panel 2 and the light emission operation of the organic EL element 21 has been briefly described here, the circuit configuration described above makes it possible to perform other operations (for example, a reset operation and an offset cancel operation of the drive transistor DRT).

In addition, although the circuit configuration of one sub-pixel SP has been described here, the sub-pixels SPR, SPG, SPB, and SPW described above have the same circuit configuration as the sub-pixel SP illustrated in FIG. 4. That is, in the present embodiment, the organic EL element 21 and the pixel circuit are arranged for each sub-pixel.

Incidentally, the circuit configuration described in FIG. 4 is an example, and the sub-pixels SPR, SPG, SPB, and SPW may have other circuit configurations different from the configuration of FIG. 4. That is, in the sub-pixels SPR, SPG, SPB, and SPW, for example, some of the circuit configuration illustrated in FIG. 4 may be changed or omitted, or another configuration may be added.

In the following description, the circuit configuration of the sub-pixels SPR, SPG, SPB, and SPW will be described with reference to FIG. 4 for convenience.

Figure 5:
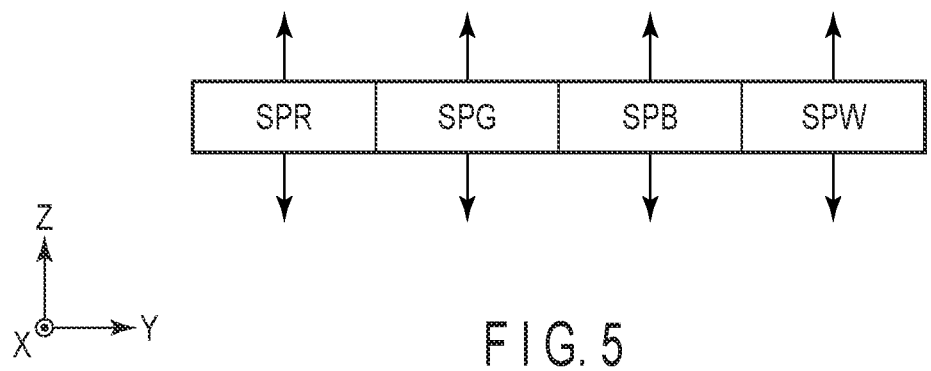
FIG. 5 is a diagram for explaining a direction of light emitted from the sub-pixel.

Here, in the present embodiment, an image is displayed on the display panel 2 (the display region DA) by causing the organic EL element 21 included in each of the sub-pixels SPR, SPG, SPB, and SPW to emit light, the light from the organic EL element 21 being emitted from both upper and lower surfaces of each of the sub-pixels SPR, SPG, SPB, and SPW (the organic EL element 21) as shown in FIG. 5. Incidentally, FIG. 5 schematically illustrates a pixel PX (sub-pixels SPR, SPG, SPB, and SPW) in cross-sectional view. In the present embodiment, the cross-sectional view means that the display device 1 (the display panel 2) is visually recognized from in the first direction X.

In this case, for example, the light emitted from the lower surfaces of the sub-pixels SPR, SPG, SPB, and SPW does not contribute to the display of the image in the display region DA located on the upper surface side of the sub-pixels SPR, SPG, SPB, and SPW, which decreases the luminance of the light visually recognized in the display region DA (the display surface). In general, the deterioration of the organic EL element 21 progresses depending on the amount of the current supplied to the organic EL element 21. When the luminance of light contributing to display in the sub-pixels SPR, SPG, SPB, and SPW is to be increased, the amount of the current supplied to the organic EL element 21 increases, which may shorten the lifetime of the organic EL element 21 included in each of the sub-pixels SPR, SPG, SPB, and SPW.

Therefore, in the present embodiment, by forming a reflective layer at a position facing the organic EL element 21, the luminance of the pixel PX including the sub-pixels SPR, SPG, SPB, and SPW is improved. Incidentally, in the present embodiment, it is assumed that the camera 6 is disposed on the back surface of the display device 1 as shown in FIG. 2, and thus, each pixel PX disposed at a position not overlapping the camera 6 and a pixel PX disposed at a position overlapping the camera 6 will be described below.

Figure 6:
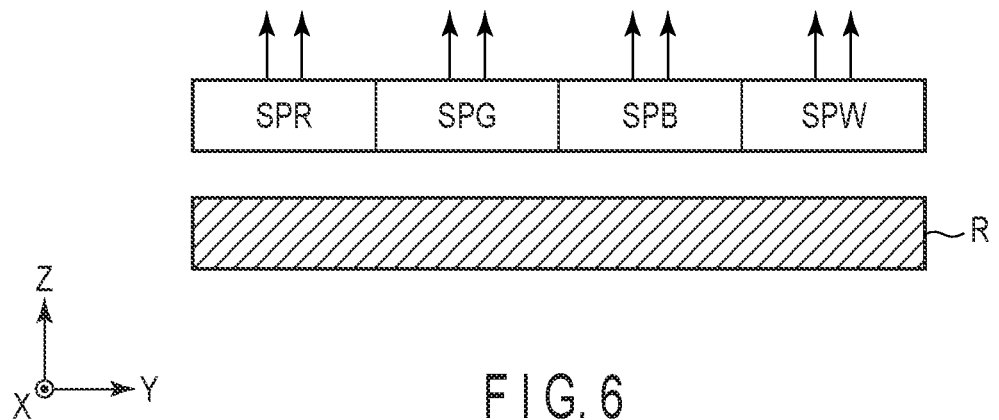
FIG. 6 is a diagram schematically illustrating a reflective layer formed in a pixel disposed at a position not overlapping a camera.

First, FIG. 6 schematically illustrates an example of a reflective layer formed in a pixel PX arranged at a position not overlapping the camera 6. As shown in FIG. 6, in the pixel PX (sub-pixels SPR, SPG, SPB, and SPW) disposed at the position not overlapping the camera 6, in order to improve the luminance of the pixel PX, a reflective layer R is formed at positions facing the organic EL elements 21 included in the sub-pixels SPR, SPG, SPB, and SPW.

According to such a configuration, the light emitted downward from the organic EL element 21 is reflected upward by the reflective layer R, so that the light emitted downward can be emitted from the display region DA. Therefore, the luminance of the light visually recognized in the display region DA can be improved.

Figure 7:
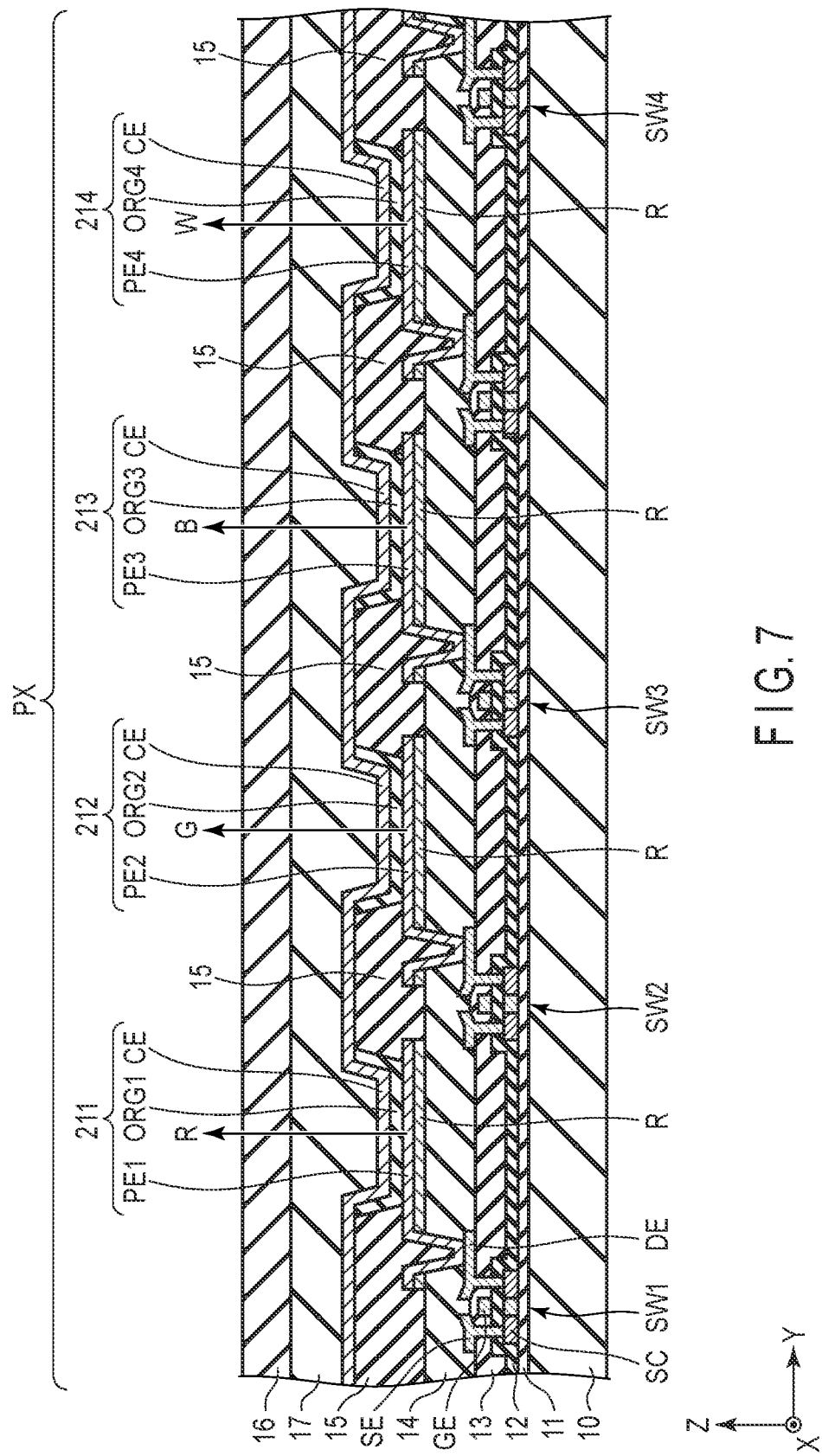
FIG. 7 is a diagram illustrating an example of a cross section of a portion of the display panel for the pixel disposed at the position not overlapping the camera.

FIG. 7 illustrates an example of a cross section of a portion of the display panel 2 for a pixel PX disposed at a position not overlapping the camera 6. As shown in FIG. 7, the display panel 2 includes an insulating substrate 10, first to fifth insulating films 11 to 15, switching elements SW1 to SW4, a reflective layer R, and organic EL elements 211 to 214.

Incidentally, the switching element SW1 corresponds to the drive transistor DRT included in the pixel circuit of the sub-pixel SPR. The switching element SW2 corresponds to the drive transistor DRT included in the pixel circuit of the sub-pixel SPG. The switching element SW3 corresponds to the drive transistor DRT included in the pixel circuit of the sub-pixel SPB. The switching element SW4 corresponds to the drive transistor DRT included in the pixel circuit of the sub-pixel SPW.

In addition, the organic EL element 211 corresponds to the organic EL element 21 included in the sub-pixel SPR. The organic EL element 212 corresponds to the organic EL element 21 included in the sub-pixel SPG. The organic EL element 213 corresponds to the organic EL element 21 included in the sub-pixel SPB. The organic EL element 214 corresponds to the organic EL element 21 included in the sub-pixel SPW.

The insulating substrate 10 is formed of, for example, an organic insulating material such as polyimide or glass. The first insulating film 11 is formed on the insulating substrate 10. The first insulating film 11 includes a barrier layer for suppressing permeation of moisture or the like from the insulating substrate 10 toward the organic EL elements 211 to 214. Incidentally, the first insulating film 11 may be omitted.

The switching elements SW1 to SW4 are formed on the first insulating film 11. Hereinafter, the configuration of the switching element SW1 will be mainly described.

The switching element SW1 includes a semiconductor layer SC, a gate electrode GE, a source electrode SE, and a drain electrode DE. In the example illustrated in FIG. 7, the source electrode SE corresponds to the second electrode of the drive transistor DRT described with reference to FIG. 4, and the drain electrode DE corresponds to the first electrode of the drive transistor DRT.

The semiconductor layer SC is formed on the first insulating film 11 and covered with the second insulating film 12. The gate electrode GE is formed on the second insulating film 12 and covered with the third insulating film 13. The gate electrode GE is formed of, for example, a metal material such as aluminum (Al), titanium (Ti), silver (Ag), molybdenum (Mo), tungsten (W), copper (Cu), or chromium (Cr), an alloy obtained by combining these metal materials, or the like. Incidentally, the gate electrode GE may have a single-layer structure or a multi-layer structure.

Each of the source electrode SE and the drain electrode DE is formed on the third insulating film 13. Each of the source electrode SE and the drain electrode DE is in contact with the semiconductor layer SC through a contact hole penetrating from the third insulating film 13 to the semiconductor layer SC. As a material for forming the source electrode SE and the drain electrode DE, the above-described metal material can be applied. The first to third insulating films 11 to 13 are formed of an inorganic insulating material such as silicon oxide, silicon nitride, or silicon oxynitride.

The switching element SW1 is covered with the fourth insulating film 14. The fourth insulating film 14 is formed of an organic insulating material.

Although the configuration of the switching element SW1 has been mainly described here, the configurations of the other switching elements SW2 to SW4 are similar to the configuration of the switching element SW1.

The organic EL elements 211 to 214 are formed on the fourth insulating film 14. In the example illustrated in FIG. 7, the organic EL element 211 includes an organic emitting layer ORG1 that emits red light, the organic EL element 212 includes an organic emitting layer ORG2 that emits green light, the organic EL element 213 includes an organic emitting layer ORG3 that emits blue light, and the organic EL element 214 includes an organic emitting layer ORG4 that emits white light. The organic emitting layers ORG1 to ORG4 enable the organic EL elements 211 to 214 to emit red (light), green (light), blue (light), and white (light), respectively.

Hereinafter, the configuration of the organic EL element 211 will be mainly described. The organic EL element 211 includes a pixel electrode PE1, a common electrode CE, and an organic emitting layer ORG1.

The pixel electrode PE1 is provided on the fourth insulating film 14. The pixel electrode PE1 functions as, for example, an anode electrode (an anode) of the organic EL element 211. The pixel electrode PE1 is electrically connected to the switching element SW1 by contacting the drain electrode DE of the switching element SW1 through a contact hole provided in the fourth insulating film 14. The organic emitting layer ORG1 is formed on the pixel electrode PE1. The organic emitting layer ORG1 may further include an electron-injection layer, a hole-injection layer, an electron-transport layer, and a hole-transport layer in order to improve light emission efficiency. The common electrode CE is formed on the organic emitting layer ORG1. The common electrode CE functions as, for example, a cathode electrode (a cathode) of the organic EL element 211.

The organic EL element 211 configured as described above emits light with a luminance corresponding to a voltage (or a current) applied between the pixel electrode PE1 and the common electrode CE.

Although the configuration of the organic EL element 211 has been mainly described here, the other configurations of the organic EL elements 212 to 214 are similar to the configuration of the organic EL element 211.

Incidentally, in the present embodiment, the pixel electrodes PE1 to PE4, which constitute the organic EL elements 211 to 214 respectively, and the common electrode CE are formed of, for example, a transparent conductive material such as indium tin oxide (ITO) or indium zinc oxide (IZO).

In addition, each of the sub-pixels SPR, SPG, SPB, and SPW has a region in which the organic EL element 21 emits light (hereinafter referred to as a light emitting portion of the sub-pixel) in a region occupied by the sub-pixel in planar view (a range in which the organic EL element 21 and the pixel circuit are formed). For example, the light emitting portion of the sub-pixel SPR in FIG. 7 is a portion (an opening) sandwiched between the pixel electrode PE1 and the common electrode CE facing each other in the organic emitting layer ORG1. The same applies to light emitting portions of the sub-pixels SPG, SPB, and SPW. Incidentally, in the present embodiment, it is assumed that the regions occupied by the sub-pixels SPR, SPG, SPB, and SPW are substantially the same.

Here, as shown in FIG. 7, a reflective layer R is formed between the fourth insulating film 14 and each of the pixel electrodes PE1 to PE4 included in the organic EL elements 211 to 214 (in other words, the organic EL elements 211 to 214 on the side opposite to the display surface of the display panel 2) The reflective layer R is formed of, for example, a metal material having a high reflectance such as aluminum or silver. A reflective surface of the reflective layer R (a surface facing the organic emitting layer ORG1) may be flat as shown in FIG. 7, or may be formed to be uneven in order to impart light scattering properties. In addition, an insulating layer may be provided between each of the pixel electrodes PE1 to PE4 and the reflective layer R.

The reflective layer R is capable of reflecting light emitted downward from the organic EL elements 211 to 214 to be emitted upward (in other words, toward the display surface), thereby improving a luminance of each of the sub-pixels SPR, SPG, SPB, and SPW.

The organic EL elements 211 to 214 (respective light emitting portions of the sub-pixels SPR, SPG, SPB, and SPW) are partitioned by a fifth insulating film (a rib) 15 made of an organic insulating material. In the example illustrated in FIG. 7, the common electrode CE is in contact with both each of the organic emitting layers ORG1 to ORG4 and the fifth insulating film 15.

Although not shown in FIG. 7, the organic EL elements 211 to 214 may be sealed with a transparent sealing film.

The display panel 2 further includes an insulating substrate 16, and the insulating substrate 16 is bonded by a transparent adhesive 17.

Incidentally, in the present embodiment, it is assumed that the insulating substrate 10, the first to fifth insulating films 11 to 15, the pixel electrodes PE1 to PE4, the organic emitting layers ORG1 to ORG4, the common electrode CE, the insulating substrate 16, and the adhesive 17 illustrated in FIG. 7 have optical transparency.

Next, a reflective layer formed in a pixel PX disposed at a position overlapping the camera 6 will be described.

Here, as described above with reference to FIG. 2, in a case where the camera 6 is disposed on the back surface side of the display panel 2, the imaging element included in the camera 6 needs to receive light via the display panel 2 (the display device 1), but visible light received by the imaging element cannot transmit through the reflective layer R described above.

Incidentally, the visible light is transmitted through regions other than the light emitting portions of the sub-pixels SPR, SPG, SPB, and SPW in planar view. However, since the switching elements SW1 to SW4 and the like are formed in the regions other than the light emitting portions, it is assumed that the imaging element included in the camera 6 is mainly irradiated with the visible light transmitted through the light emitting portions.

In this case, for example, as shown in FIGS. 6 and 7, if the reflective layer R is formed at positions facing the organic EL elements 211 to 214 (in other words, the light emitting portions) included in the sub-pixels SPR, SPG, SPB, and SPW, a sufficient amount of visible light cannot transmit through the pixel PX including the sub-pixels SPR, SPG, SPB, and SPW, and the imaging element included in the camera 6 cannot be appropriately exposed.

In contrast, in a case where the reflective layer R is not formed in all the sub-pixels SPR, SPG, SPB, and SPW included in the pixel PX, a luminance decreases in the sub-pixel in which the reflective layer R is not formed among the sub-pixels SPR, SPG, SPB, and SPW as described above with reference to FIG. 5.

Incidentally, for example, the organic emitting layer ORG1 included in the organic EL element 211 described above includes an optical path adjustment layer adjusted to emit red light corresponding to the organic EL element 211 (in other words, to improve the luminance of light in the red wavelength band). In addition, the organic emitting layer ORG2 included in the organic EL element 212 has an optical path adjustment layer adjusted to emit green light (in other words, to improve the luminance of light in the green wavelength band). Similarly, the organic emitting layer ORG3 included in the organic EL element 213 has an optical path adjustment layer adjusted to emit blue light (in other words, to improve the luminance of light in the blue wavelength band).

The optical path adjustment layer adjusted to emit light of each color as described above affects a transmittance of light. Specifically, the organic emitting layer ORG1 included in the organic EL element 211 has a relatively high transmittance with respect to light close to a red component, but has a low transmittance with respect to light of the other color components. In addition, the organic emitting layer ORG2 included in the organic EL element 212 has a relatively high transmittance with respect to light close to a green component, but has a low transmittance with respect to light of the other color components. In addition, the organic emitting layer ORG3 included in the organic EL element 213 has a relatively high transmittance with respect to light close to a blue component, but has a low transmittance with respect to light of the other color components.

According to this, it is considered that the visible light including light of various wavelength bands cannot sufficiently transmit through the regions occupied by the sub-pixels SPR, SPG, and SPB in planar view. In other words, it can be said that the sub-pixels SPR, SPG, and SPB have a low contribution to transmission of visible light.

On the other hand, the sub-pixel SPW includes the organic EL element 214 that emits white light, but the above-described optical path adjustment as in the organic emitting layers ORG1 to ORG3 (the optical path adjustment layers) included in the sub-pixels SPR, SPG, and SPB is not performed in the organic emitting layer ORG4 included in the organic EL element 21. Thus, it is considered that the region occupied by (the organic emitting layer ORG4 included in the organic EL element 214 of) the sub-pixel SPW has a higher transmittance with respect to visible light than those occupied by the other sub-pixels SPR, SPG, and SPB.

Figure 8:
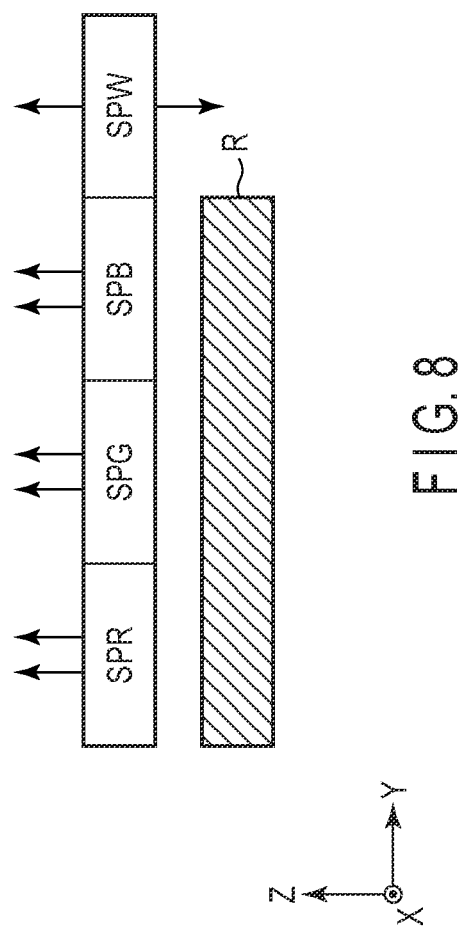
FIG. 8 is a diagram schematically illustrating an example of a reflective layer formed in a pixel disposed at a position overlapping the camera.

Therefore, in the present embodiment, in the pixel PX disposed at a position overlapping the camera 6 (the imaging element) as shown in FIG. 8, the reflective layer R is not formed at a position facing the organic EL element 214 having a high visible light transmittance, and the reflective layer R is formed at positions facing the organic EL elements 211 to 213 having a low visible light transmittance.

Figure 9:
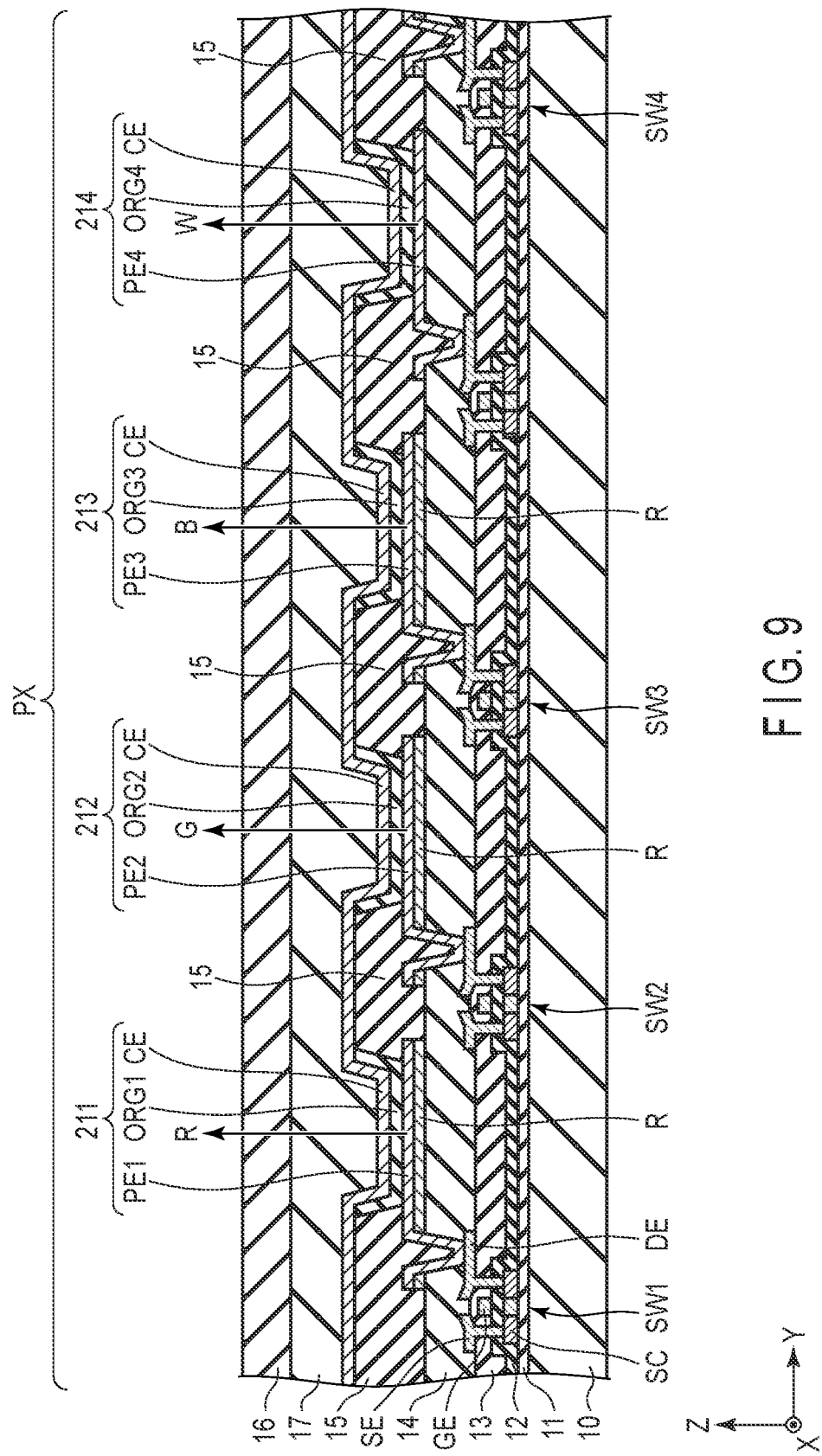
FIG. 9 is a diagram illustrating an example of a cross section of a portion of the display panel for the pixel disposed at the position overlapping the camera.

FIG. 9 illustrates an example of a cross section of a portion of the display panel 2 for a pixel PX disposed at a position overlapping the camera 6.

Incidentally, in FIG. 9, the same parts as those in FIG. 7 are denoted by the same reference signs as those in FIG. 7, and the detailed description thereof will be omitted. Here, differences from FIG. 7 will be mainly described.

As shown in FIG. 9, in the pixel PX disposed at a position overlapping the camera 6, the reflective layer R is formed at positions facing the organic EL elements 211 to 213 (respective light emitting portions of the sub-pixels SPR, SPG, and SPB).

In contrast, the reflective layer R is not formed at a position facing the organic EL element 214 (a light emitting portion of the sub-pixel SPW).

As described above, an electronic apparatus according to the present embodiment includes: a display device 1 (a display panel 2) in which a sub-pixel SPR (a second pixel) having an organic EL element 211 that emits red light, a sub-pixel SPG (a third pixel) having an organic EL element 212 that emits green light, a sub-pixel SPB (a fourth pixel) having an organic EL element 213 that emits blue light, and a sub-pixel SPW (a first pixel) having an organic EL element 214 that emits white light are arranged; a camera 6 having an imaging element that receives light through the display device 1; and a reflective layer R. In a case where the sub-pixels SPR, SPG, SPB, and SPW are disposed at a position overlapping the imaging element (the camera 6) in planar view, the reflective layer R is not formed at a position facing the organic EL element 214 having a high transmittance with respect to light (for example, visible light) received by the imaging element, but is formed at a position facing each of the organic EL elements 211 to 213 having a low transmittance with respect to the light.

In the present embodiment, with such a configuration, even in a case where the camera 6 is disposed on the back surface side of the display device 1, a sufficient amount of visible light can be transmitted through the imaging element via the sub-pixel SPW (the organic EL element 214) having a high transmittance, and the luminance of the sub-pixels SPR, SPG, and SPB having a low contribution to the transmission of the visible light can be improved by the reflective layer R.

Incidentally, the pixel PX disposed at a position not overlapping the camera 6 (the imaging element) does not need to transmit visible light, and thus may be configured as shown in FIGS. 6 and 7. That is, in the pixel PX disposed at a position not overlapping the camera 6, the luminance of the pixel PX can be improved by forming the reflective layer R at positions facing all of the organic EL elements 211 to 214 included in the sub-pixels SPR, SPG, SPB, and SPW.

As described above, since the reflective layer R is not formed at the position facing the organic EL element 214 included in the sub-pixel SPW, the maximum luminance realized in the sub-pixel SPW is lower than those realized in the sub-pixels SPR, SPG, and SPB in which the reflective layer R is formed. For this reason, the driver IC chip 5 that drives the display panel 2 controls (light emission amounts of) the organic EL elements 211 to 214 depending on whether or not the reflective layer R is formed.

Incidentally, in a case where the maximum luminance realized in the sub-pixel SPW is lower than those realized in the other sub-pixels SPR, SPG, and SPB as described above, if a similar luminance is realized in the sub-pixels SPR, SPG, SPB, and SPW, an amount of current supplied to the organic EL element 214 included in the sub-pixel SPW is larger than those supplied to the other sub-pixels SPR, SPG, and SPB. For example, by reducing the areas of the light emitting portions of the sub-pixels SPR, SPG, and SPB and increasing the area of the light emitting portion of the sub-pixel SPW accordingly, the current supplied to the organic EL element 214 increases.

In this case, the organic EL element 214 included in the sub-pixel SPW deteriorates faster than the organic EL elements 211 to 213 included in the sub-pixels SPR, SPG, and SPB, respectively.

When the degree of progress of deterioration varies between the organic EL elements 211 to 213 and the organic EL element 214 as described above, the luminance of the organic EL element 214 is lower than those of the organic EL elements 211 to 213 as the deterioration of the organic EL element 214 progresses, and there is a possibility that appropriate display in the pixel PX cannot be performed (in other words, display accuracy degrades).

Therefore, in the present embodiment, a configuration for suppressing a variation in degree of progress of deterioration between the organic EL elements 211 to 213 and the organic EL element 214 described above may be adopted.

Specifically, the maximum luminances realized in the sub-pixels SPR, SPG, SPB, and SPW vary depending on (proportions of) the areas of the light emitting portions of the sub-pixels SPR, SPG, SPB, and SPW. That is, the maximum luminance in the sub-pixel can be increased by increasing the area of the light emitting portion, and the maximum luminance in the sub-pixel can be decreased by decreasing the area of the light emitting portion.

In this case, for example, the sub-pixel SPW is configured such that (the area of) the light emitting portion of the sub-pixel SPW occupies most of (the area of) the region occupied by the sub-pixel SPW in planar view. In contrast, the sub-pixels SPR, SPG, and SPB are configured such that (the areas of) the light emitting portions of the sub-pixels SPR, SPG, and SPB are smaller than (the area of) the light emitting portion of the sub-pixel SPW described above.

That is, in the present embodiment, by setting (a proportion of) the area of the light emitting portion of the sub-pixel SPW to the pixel PX to be higher than that of each of the sub-pixels SPR, SPG, and SPB as described above, a difference between the maximum luminances realized in the sub-pixels SPR, SPG, SPB, and SPW decreases (in other words, the same degree of luminance can be realized with the same degree of current amount). Therefore, it is possible to suppress a variation in degree of progress of deterioration between the organic EL elements 211 to 214.

Incidentally, in the present embodiment, although it has been described that the reflective layer R is not formed at a position facing the organic EL element 214 included in the sub-pixel SPW, the reflective layer R may be formed at a position facing a partial portion of the organic EL element 214. In this case, the amount of visible light transmitted through the imaging element included in the camera 6 is decreased, but the luminance in the sub-pixel SPW can be improved.

In addition, although it has been described that the sub-pixels SPR, SPG, and SPB (the organic EL elements 211 to 213) have a low contribution to transmission of visible light, but can transmit light in a specific wavelength band. Therefore, in a case where it is desired to increase the amount of light received in the imaging element included in the camera 6, it is also possible to form the reflective layer R at a position facing a partial portion of each of the organic EL elements 211 to 213 included in the sub-pixels SPR, SPG, and SPB, and transmit light in the regions of the sub-pixels SPR, SPG, and SPB where the reflective layer R is not formed.

In addition, in the present embodiment, although it has been described that the sub-pixels SPR, SPG, SPB, and SPW include organic emitting layers ORG1 to ORG4 that emit light of respective colors, the display panel 2 may include, for example, a common organic emitting layer that emits white light over a plurality of pixels PX (sub-pixels SPR, SPG, SPB, and SPW). In other words, all of the organic emitting layers ORG1 to ORG4 may be organic emitting layers that emit white light. In this case, the display panel 2 includes a color filter colored in red at a position facing the organic EL element 211 (a position in a direction toward the display surface of the display panel 2), a color filter colored in green at a position facing the organic EL element 212, and a color filter colored in blue at a position facing the organic EL element 213. As a result, the sub-pixels SPR, SPG, SPB, and SPW can emit red light, green light, blue light, and white light, respectively.

The color filter used in such a configuration is considered to affect a transmittance of light, similarly to the optical path adjustment layer described above. Therefore, the present embodiment may be applied to the display device 1 (the electronic apparatus) including the display panel 2 configured to use such color filters. That is, even in the configuration using the color filters, for example, visible light can be transmitted through the imaging element by not forming the reflective layer R at a position facing the organic EL element 214 included in the sub-pixel SPW, and luminance can be improved by forming the reflective layer R at a position facing each of the organic EL elements 211 to 213 included in the sub-pixels SPR, SPG, and SPB.

Incidentally, concerning the electronic apparatus according to the present embodiment, although it has been described that the camera 6 (the visible light camera) that receives visible light to capture a color image is disposed on the back surface of the display device 1, for example, an infrared camera having an imaging element that receives infrared light (infrared rays) may be arranged on the back surface of the display device 1.

Figure 10:
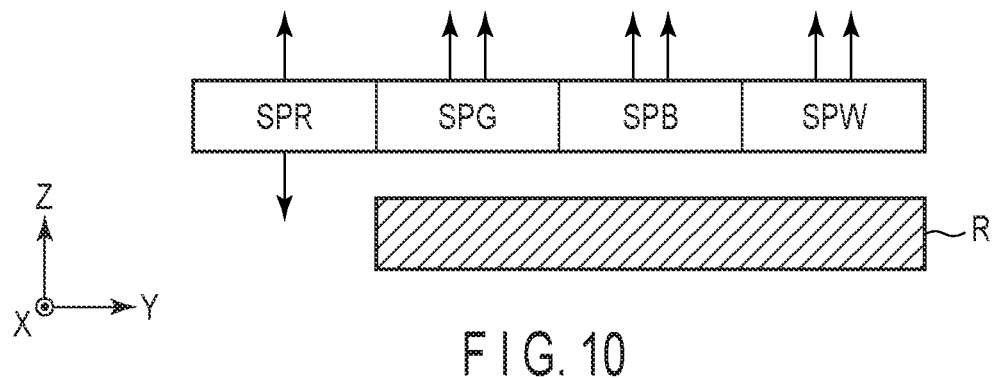
FIG. 10 is a diagram schematically illustrating another example of a reflective layer formed in a pixel disposed at a position overlapping the camera.

In such a configuration, for example, in a case where the sub-pixel SPR (the first pixel) has a relatively high transmittance with respect to infrared light (infrared rays) received by the imaging element included in the infrared camera, the pixel PX may be configured, as shown in FIG. 10, so that the reflective layer R is not formed at a position facing the organic EL element 211 included in the sub-pixel SPR, and the reflective layer R is formed at positions facing the organic EL elements 212 to 214 included in the sub-pixels SPG, SPB, and SPW.

Incidentally, in a case where the reflective layer R is not formed at the position facing the organic EL element 211 included in the sub-pixel SPR, and the reflective layer R is formed at the positions facing the organic EL elements 212 to 214 included in the sub-pixels SPG, SPB, and SPW, (the areas of) the light emitting portions of the sub-pixels SPG, SPB, and SPW may be smaller than (the area of) the light emitting portion of the sub-pixel SPR in order to suppress a variation in degree of progress of deterioration between the organic EL elements 211 to 214.

In addition, in the configuration in which, for example, an infrared camera is arranged on the back surface of the display device 1, in a case where the sub-pixel SPW has a relatively high transmittance with respect to infrared light, the pixel PX may be configured in the same manner as in FIG. 8 described above.

Furthermore, in the case of an electronic apparatus in which both a visible light camera and an infrared camera are arranged on the back surface of the display device 1, a pixel PX disposed at a position overlapping the visible light camera may be configured as shown in FIG. 8, and a pixel PX disposed at a position overlapping the infrared camera may be configured as shown in FIG. 10.

Figure 11:
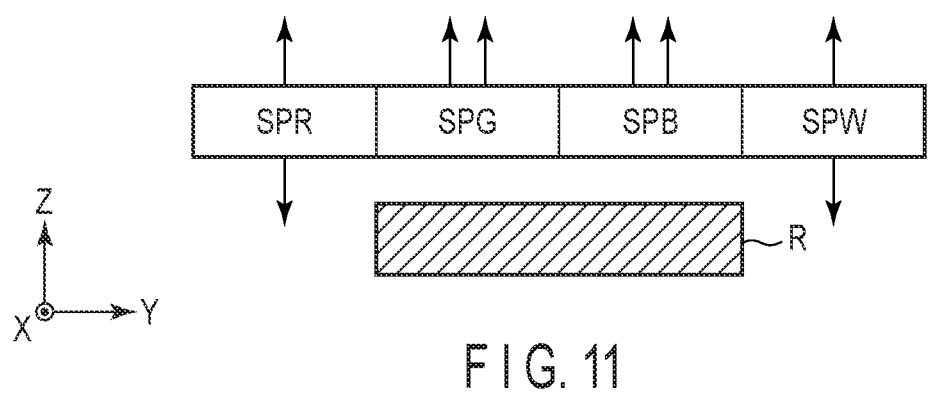
FIG. 11 is a diagram schematically illustrating another example of a reflective layer formed in a pixel disposed at a position overlapping the camera.

In addition, as shown in FIG. 11, the pixel PX may be commonly disposed at a position overlapping each of the visible light camera (the second imaging element) and the infrared camera (the first imaging element) so that the reflective layer R is not formed at positions facing the organic EL elements 211 and 214 included in the sub-pixels SPR and SPW, respectively, and the reflective layer R is formed at positions facing the organic EL elements 212 and 213 included in the sub-pixels SPG and SPB. According to this, the pixels PX having the same configuration can handle both visible light and infrared light. In this case, in order to suppress a variation in degree of progress of deterioration between the organic EL elements 211 to 214, (the areas of) the light emitting portions of the sub-pixels SPG and SPB may be smaller than (the areas of) the light emitting portions of the sub-pixels SPR and SPW.

Figure 12:
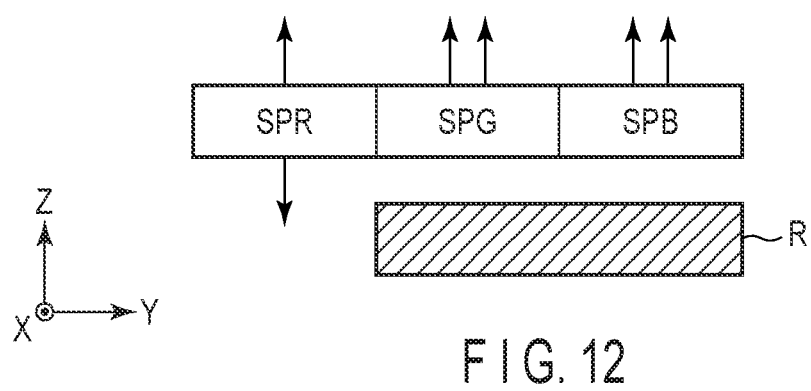
FIG. 12 is a diagram schematically illustrating an example of a reflective layer formed in a pixel including three sub-pixels.

Incidentally, in the present embodiment, although it has been described that the pixel PX includes sub-pixels SPR, SPG, SPB, and SPW, the pixel PX may include, for example, sub-pixels SPR, SPG, and SPB (in other words, sub-pixels corresponding to three colors). In such a configuration, for example, in a case where the infrared camera is arranged on the back surface of the display device 1, the pixel PX may be configured, as shown in FIG. 12, so that the reflective layer R is not formed at a position facing the organic EL element 211 (the first light emitting element) having a higher transmittance of light received by the imaging element of the infrared camera than the organic EL elements 212 and 213 (the second and third light emitting elements), and the reflective layer R is formed at positions facing the organic EL elements 212 and 213. As described above, the present embodiment may be applied to a configuration in which the pixel PX includes sub-pixels SPR, SPG, and SPB.

In the present embodiment, although the electronic apparatus in which the visible light camera or the infrared camera is arranged on the back surface of the display device 1 has been mainly described, the present embodiment can be applied to any electronic apparatus in which a device having an imaging element (a light receiving element) that receives light via the display device 1 is disposed at a position overlapping a pixel PX.

In addition, in the present embodiment, it has been mainly described that the reflective layer R is not formed at the positions facing the organic EL element 211 included in the sub-pixel SPR or the organic EL element 214 included in the sub-pixel SPW, and the reflective layer R is formed at least at the positions facing the organic EL elements 212 and 213 included in the sub-pixels SPG and SPB. However, depending on what device is arranged on the back surface of the display device 1 described above, the reflective layer R may not be formed at the position facing the organic EL element 212 included in the sub-pixel SPG or the organic EL element 213 included in the sub-pixel SPB, and the reflective layer R may be formed at the positions facing the organic EL elements 211 and 214 included in the sub-pixels SPR and SPW. In other words, in the present embodiment, the sub-pixel (the organic EL element) in which the reflective layer R is formed and the sub-pixel (the organic EL element) in which the reflective layer R is not formed may be appropriately selected (determined) according to light received by the imaging element.

Second Embodiment

Next, a second embodiment will be described. Incidentally, in the present embodiment, detailed description about parts similar to those in the first embodiment described above will be omitted, and parts different from those in the first embodiment will be mainly described. In addition, configurations of an electronic apparatus and a display device according to the present embodiment will be described, appropriately using FIGS. 1 to 4, etc.

Here, in the first embodiment described above, it has been described, for example, as shown in FIG. 7, that the reflective layer R is not formed at a position facing the organic EL element 214 included in the sub-pixel SPW disposed at a position overlapping the camera 6, and the reflective layer R is formed at positions facing the organic EL elements 211 to 213 included in the sub-pixels SPR, SPG, and SPB. However, in such a configuration, there is a possibility that the camera 6 arranged on the back surface of the display device 1 cannot be efficiently used.

Specifically, as described above, when the camera 6 is used (that is, the camera 6 operates) in a state where the organic EL element 214 included in the sub-pixel SPW, in which the reflective layer R is not formed, emits light, the imaging element included in the camera 6 receives the light from the organic EL element 214 emitted from the lower surface of the sub-pixel SPW, and cannot capture an appropriate image based on light received through the display device 1 (in other words, light transmitted through the display device 1).

That is, when the camera 6 operates in the configuration of the first embodiment described above, at least the organic EL element 214 cannot emit light. Incidentally, the same applies to, for example, a case where the reflective layer R is not formed at a position facing the organic EL element 211 included in the sub-pixel SPR.

For this reason, when the camera 6 operates, it may be considered, for example, to display a pixel PX disposed at a position overlapping the camera 6 in black. However, in such a configuration, the camera 6 cannot be used while keeping displaying an image in the display region DA including the pixel PX.

Here, a pixel PX disposed at a position overlapping the camera 6 in the present embodiment will be described with reference to FIG. 13. Incidentally, FIG. 13 schematically illustrates an example of a reflective layer formed in the pixel PX disposed at the position overlapping the camera 6.

Figure 13:
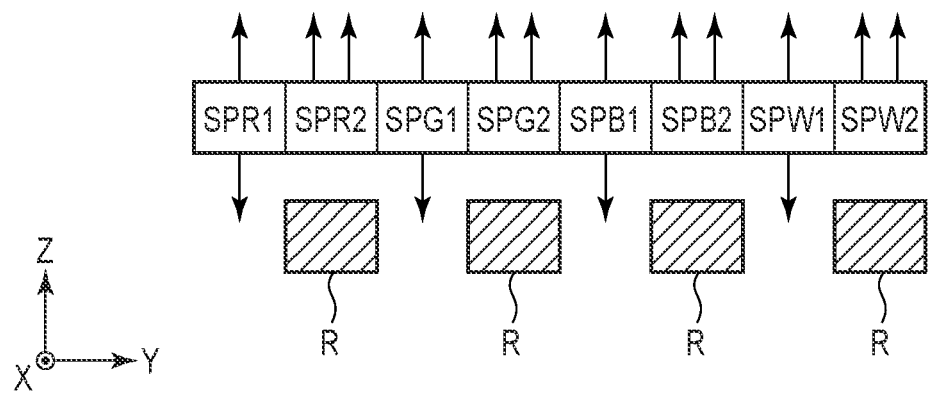
FIG. 13 is a diagram schematically illustrating an example of a reflective layer formed in a second embodiment.

In the present embodiment, as shown in FIG. 13, the pixel PX disposed at the position overlapping the camera 6 includes two sub-pixels SPR1 and SPR2 each having an organic EL element 211 that emits red light, two sub-pixels SPG1 and SPG2 each having an organic EL element 212 that emits green light, two sub-pixels SPB1 and SPB2 each having an organic EL element 213 that emits blue light, and two sub-pixels SPW1 and SPW2 having an organic EL element 214 that emits white light.

Furthermore, in the present embodiment, the reflective layer R is not arranged at positions facing the organic EL element 211 included in the sub-pixel SPR1, the organic EL element 212 included in the sub-pixel SPG1, the organic EL element 213 included in the sub-pixel SPB1, and the organic EL element 214 included in the sub-pixel SPW1. In contrast, the reflective layer R is disposed at positions facing the organic EL element 211 included in the sub-pixel SPR2, the organic EL element 212 included in the sub-pixel SPG2, the organic EL element 213 included in the sub-pixel SPB2, and the organic EL element 214 included in the sub-pixel SPW2.

Figure 14:
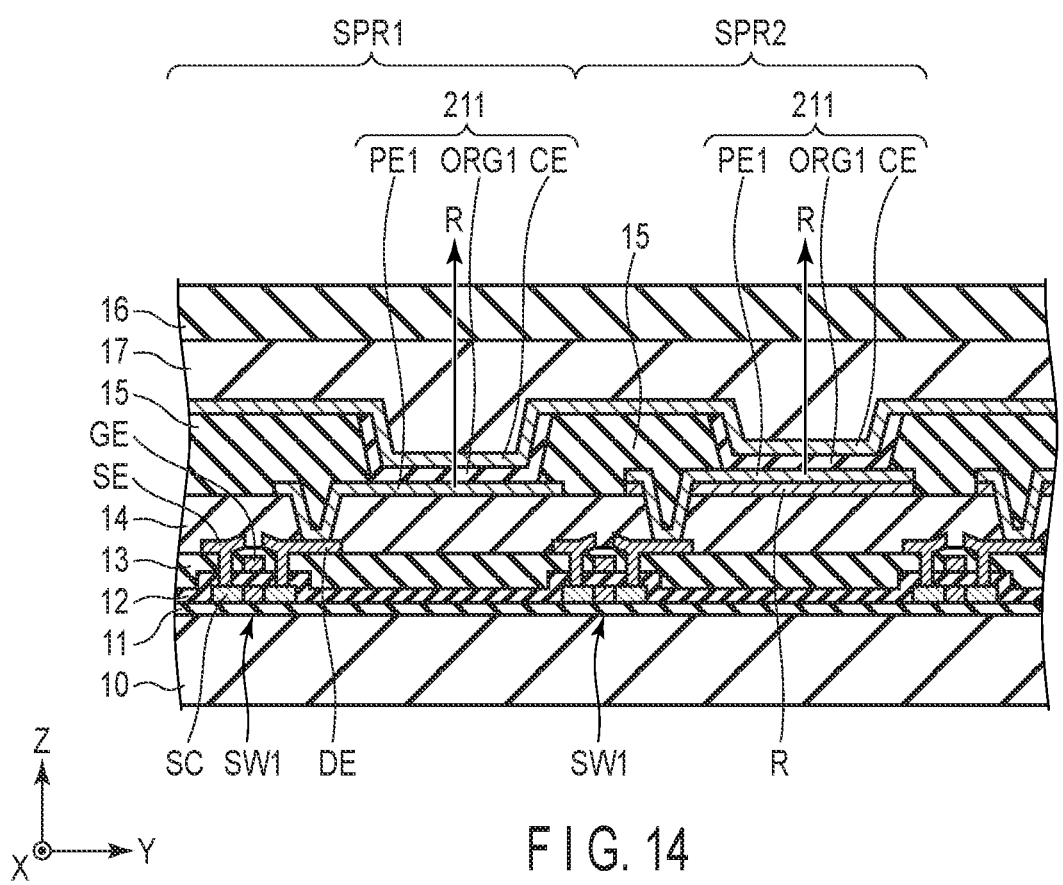
FIG. 14 is a diagram illustrating an example of a cross section of a portion of a display panel for a pixel disposed at a position overlapping a camera.

FIG. 14 illustrates an example of a cross section of a portion of a display panel 2 for the pixel PX disposed at the position overlapping the camera 6 in the present embodiment. Here, the sub-pixels SPR1 and SPR2 included in the pixel PX will be mainly described.

Incidentally, in FIG. 14, the same parts as those in FIG. 7 are denoted by the same reference signs as those in FIG. 7, and the detailed description thereof will be omitted. Here, differences from FIG. 7 will be mainly described.

As shown in FIG. 14, the reflective layer R is not formed at a position facing the organic EL element 211 in the sub-pixel SPR1, and the reflective layer R is formed at a position facing the organic EL element 211 in the sub-pixel SPR2.

In addition, a pixel electrode PE1 included in the organic EL element 211 of the sub-pixel SPR1 is electrically connected to a switching element SW1 provided for the sub-pixel SPR1. Similarly, a pixel electrode PE1 included in the organic EL element 211 of the sub-pixel SPR2 is electrically connected to a switching element SW1 provided for the sub-pixel SPR2.

That is, in the present embodiment, the organic EL element 211 and the pixel circuit including the switching element SW1 (the drive transistor DRT) are arranged for each of the sub-pixels SPR1 and SPR2, and the sub-pixels SPR1 and SPR2 are configured to be independently drivable.

Furthermore, in the present embodiment, it is assumed that (proportions of) areas of regions occupied by (light emitting portions of) the sub-pixels SPR1 and SPR2 is substantially the same.

Although only the sub-pixels SPR1 and SPR2 have been described here, the same also applies to the sub-pixels SPG1 and SPG2, the sub-pixels SPB1 and SPB2, and the sub-pixels SPW1 and SPW2.

Incidentally, in the present embodiment, (proportions of) areas of regions occupied by the sub-pixels SPR1 and SPR2, areas of regions occupied by the sub-pixels SPG1 and SPG2, areas of regions occupied by the sub-pixels SPB1 and SPB2, and areas of regions occupied by the sub-pixels SPW1 and SPW2 are substantially the same in planar view.

Although the pixel PX disposed at the position overlapping the camera 6 has been described here, a pixel PX disposed at a position not overlapping the camera 6 may be configured, for example, as described above with reference to FIGS. 6 and 7.

Hereinafter, an outline of an operation of the display device 1 (the electronic apparatus) when the pixel PX (the sub-pixels SPR1, SPR2, SPG1, SPG2, SPB1, SPB2, SPW1, and SPW2) described above with reference to FIGS. 13 and 14 is disposed at the position overlapping the camera 6 will be described.

First, it is assumed that (the imaging element included in) the camera 6 does not operate, and the display device 1 (the display panel 2) performs normal display. In this case, the light emission of the organic EL elements 211 to 214 included in the sub-pixels SPR1, SPR2, SPG1, SPG2, SPB1, SPB2, SPW1, and SPW2 does not affect the imaging element. Therefore, in a case where the camera 6 does not operate, the driver IC chip 5 can cause all of the organic EL elements 211 to 214 included in the sub-pixels SPR1, SPR2, SPG1, SPG2, SPB1, SPB2, SPW1, and SPW2 included in the pixel PX disposed at the position overlapping the camera 6 to emit light.

That is, during normal display in which the camera 6 does not operate, although the reflective layer R is not formed at positions facing the organic EL elements 21 included in the sub-pixels SPR1, SPG1, SPB1, and SPW1, high luminance can be realized throughout the entire pixel PX by the reflective layer R formed at positions facing the organic EL elements 21 included in the sub-pixels SPR2, SPG2, SPB2, and SPW2.

Next, it is assumed that (the imaging element included in) the camera 6 operates, and the camera 6 captures an image (in other words, the camera 6 is used in the electronic apparatus). In this case, assuming that the organic EL elements 211 to 214 included in the sub-pixels SPR1, SPG1, SPB1, and SPW1 in which the reflective layer R is not formed emit light, the light from the organic EL elements 211 to 214 is irradiated to the imaging element. That is, the light emission of the organic EL elements 211 to 214 included in the sub-pixels SPR1, SPG1, SPB1, and SPW1 affects an image captured by the imaging element.

In contrast, even if the organic EL elements 211 to 214 included in the sub-pixels SPR2, SPG2, SPB2, and SPW2 in which the reflective layer R is formed emits light when the camera 6 operates, the light from the organic EL elements 211 to 214 is reflected by the reflective layer R. That is, the light emission of the organic EL elements 211 to 214 included in the sub-pixels SPR2, SPG2, SPB2, and SPW2 does not affect an image captured by the imaging element.

For this reason, in the present embodiment, when the camera 6 operates, the driver IC chip 5 causes the organic EL elements 211 to 214 included in the sub-pixels SPR2, SPG2, SPB2, and SPW2 in which the reflective layer R is formed to emit light, among the sub-pixels SPR1, SPR2, SPG1, SPG2, SPB1, SPB2, SPW1, and SPW2 included in the pixel PX disposed at the position overlapping the camera 6.

According to this, since the organic EL elements 21 included in the sub-pixels SPR1, SPG1, SPB1, and SPW1 do not emit light, the luminance decreases as compared with that in the normal display described above, but the display in the pixel PX can be maintained (in other words, the pixel PX does not need to be displayed in black) because the organic EL elements 211 to 214 included in the sub-pixels SPR2, SPG2, SPB2, and SPW2 can emit light.

As described above, in the present embodiment, the reflective layer R is not formed at positions facing the organic EL element 211 (the first light emitting element) included in the sub-pixel SPR1 (the first pixel), the organic EL element 212 (the second light emitting element) included in the sub-pixel SPG1 (the third pixel), the organic EL element 213 (the third light emitting element) included in the sub-pixel SPB1 (the fifth pixel), and the organic EL element 214 (the fourth light emitting element) included in the sub-pixel SPW1 (the seventh pixel). In contrast, the reflective layer R is formed at positions facing the organic EL element 211 (the first light emitting element) included in the sub-pixel SPR2 (the second pixel), the organic EL element 212 (the second light emitting element) included in the sub-pixel SPG2 (the fourth pixel), the organic EL element 213 (the third light emitting element) included in the sub-pixel SPB2 (the sixth pixel), and the organic EL element 214 (the fourth light emitting element) included in the sub-pixel SPW2 (the eighth pixel).

Incidentally, in the present embodiment, for example, in a case where the imaging element included in the camera 6 operates (in other words, the camera 6 captures an image), the organic EL elements 21 (the organic EL elements 211 to 214) included in the sub-pixels SPR2, SPG2, SPB2, and SPW2, in which the reflective layer R is formed, emit light.

In the present embodiment, with such a configuration, even in a case where the imaging element included in the camera 6 operates, it is possible to maintain the display in the pixel PX disposed at the position overlapping the camera 6. In addition, the camera 6 disposed on the back surface of the display device 1 can appropriately receive light (for example, visible light) (in other words, capture an image) via the sub-pixels SPR1, SPG1, SPB1, and SPW1 in which the reflective layer R is not formed.

That is, in the present embodiment, it is possible to achieve both the display in the pixel PX disposed at the position overlapping the camera 6 disposed on the back surface of the display device 1 and the light reception by the imaging element of the camera 6 (in other words, the use of the camera 6).

Incidentally, in the present embodiment, as compared with the configuration described above in the first embodiment, a variation in degree of progress of deterioration less likely to occur between the organic EL elements 211 to 214 included in the sub-pixels SPR1, SPR2, SPG1, SPG2, SPB1, SPB2, SPW1, and SPW2.

Here, the case where the imaging element included in the camera 6 operates has been described. However, in a case where the imaging element does not operate, by causing all the organic EL elements 211 to 214 of the sub-pixels SPR1, SPR2, SPG1, SPG2, SPB1, SPB2, SPW1, and SPW2 included in the pixel PX to emit light, luminance in the pixel PX can be improved as compared that in the case where the imaging element operates.

Incidentally, the present embodiment may be applied to (an electronic apparatus including) a display device 1 using the color filters described above in the first embodiment, although detailed description thereof is omitted. In addition, the present embodiment may be applied to an electronic apparatus in which an infrared camera having an imaging element that receives infrared light (infrared rays) is disposed on the back surface of the display device 1. In addition, both a visible light camera and an infrared camera may be disposed on the back surface of the display device 1.

Furthermore, in the present embodiment, although it has been described that the pixel PX includes sub-pixels SPR1, SPR2, SPG1, SPG2, SPB1, SPB2, SPW1, and SPW2, the present embodiment may be applied to a configuration in which a pixel PX includes sub-pixels SPR1, SPR2, SPG1, SPG2, SPB1, and SPB2 (in other words, sub-pixels corresponding to three colors).

In addition, in the present embodiment, it is assumed that the areas of the regions occupied by, for example, the two sub-pixels SPR1 and SPR2 in planar view are substantially the same, but may be different, for example, depending on light received by the imaging element. The same also applies to the sub-pixels SPG1 and SPG2, the sub-pixels SPB1 and SPB2, and the sub-pixels SPW1 and SPW2.

Furthermore, proportions of the areas of the regions occupied by the sub-pixels SPR1 and SPR2, the areas of the regions occupied by the sub-pixels SPG1 and SPG2, the areas of the regions occupied by the sub-pixels SPB1 and SPB2, and the areas of the regions occupied by the sub-pixels SPW1 and SPW2 may be changed according to the light received by the imaging element described above.

All electronic apparatuses and display devices, which are implementable with arbitrary changes in design by a person of ordinary skill in the art based on the electronic apparatuses and display devices described above as the embodiments of the present invention, belong to the scope of the present invention as long as they encompass the spirit of the present invention.

Various modifications are easily conceivable within the category of the idea of the present invention by a person of ordinary skill in the art, and these modifications are also considered to belong to the scope of the present invention. For example, additions, deletions or changes in design of the constituent elements or additions, omissions or changes in condition of the processes may be arbitrarily made to the above embodiments by a person of ordinary skill in the art, and these modifications also fall within the scope of the present invention as long as they encompass the spirit of the present invention.

In addition, the other advantages of the aspects described in the above embodiments, which are obvious from the descriptions of the specification or which are arbitrarily conceivable by a person of ordinary skill in the art, are considered to be achievable by the present invention as a matter of course.

What is claimed is:

1. An electronic apparatus comprising:
   a display panel in which a first pixel including a first light emitting element configured to emit light of a first color, a second pixel including a second light emitting element configured to emit light of a second color, and a third pixel including a third light emitting element configured to emit light of a third color are arranged; and
   an imaging element configured to receive light via the display panel, wherein
   the first to third pixels are disposed at positions overlapping the imaging element in planar view, and
   the display panel includes a reflective layer that is not formed at a position facing the first light emitting element, and is formed at positions facing the second and third light emitting elements.

2. The electronic apparatus according to claim 1, wherein the imaging element is configured to receive infrared light, and the first color is red.

3. The electronic apparatus according to claim 1, wherein
   the first pixel includes a first light emitting portion corresponding to a region in which the first light emitting element emits the light of the first color,
   the second pixel includes a second light emitting portion corresponding to a region in which the second light emitting element emits the light of the second color,
   the third pixel includes a third light emitting portion corresponding to a region in which the third light emitting element emits the light of the third color, and
   a proportion of an area of the first light emitting portion in planar view is higher than that of each of the second and third light emitting portions in planar view.

4. The electronic apparatus according to claim 1, further comprising a fourth pixel arranged in the display panel, the fourth pixel including a fourth light emitting element configured to emit light of a fourth color, wherein
   the fourth pixel is disposed at a position overlapping the imaging element in planar view,
   the imaging element is configured to receive visible light, and the first color is white, and
   the reflective layer is formed at a position facing the fourth light emitting element.

5. The electronic apparatus according to claim 4, wherein
   the first pixel includes a first light emitting portion corresponding to a region in which the first light emitting element emits the light of the first color,
   the second pixel includes a second light emitting portion corresponding to a region in which the second light emitting element emits the light of the second color,
   the third pixel includes a third light emitting portion corresponding to a region in which the third light emitting element emits the light of the third color,
   the fourth pixel includes a fourth light emitting portion corresponding to a region in which the fourth light emitting element emits the light of the fourth color, and
   a proportion of an area of the first light emitting portion in planar view is higher than that of each of the second to fourth light emitting portions in planar view.

6. The electronic apparatus according to claim 1, further comprising a fourth pixel arranged in the display panel, the fourth pixel including a fourth light emitting element configured to emit light of a fourth color, wherein
   the fourth pixel is disposed at a position overlapping the imaging element in planar view,
   the imaging element includes a first imaging element configured to receive infrared light and a second imaging element configured to receive visible light, the first color is red, and the fourth color is white, and
   the reflective layer is not formed at a position facing the fourth light emitting element.

7. The electronic apparatus according to claim 6, wherein
   the first pixel includes a first light emitting portion corresponding to a region in which the first light emitting element emits the light of the first color,
   the second pixel includes a second light emitting portion corresponding to a region in which the second light emitting element emits the light of the second color,
   the third pixel includes a third light emitting portion corresponding to a region in which the third light emitting element emits the light of the third color,
   the fourth pixel includes a fourth light emitting portion corresponding to a region in which the fourth light emitting element emits the light of the fourth color, and
   a proportion of an area of each of the first and fourth light emitting portions in planar view is higher than that of each of the second to third light emitting portions in planar view.

8. An electronic apparatus comprising:
   a display panel in which first and second pixels each including a first light emitting element configured to emit light of a first color, third and fourth pixels each including a second light emitting element configured to emit light of a second color, and fifth and sixth pixels each including a third light emitting element configured to emit light of a third color are arranged; and
   an imaging element configured to receive light via the display panel, wherein
   the first to sixth pixels are disposed at positions overlapping the imaging element in planar view, and
   the display panel includes a reflective layer that is not formed at positions facing the first light emitting element included in the first pixel, the second light emitting element included in the third pixel, and the third light emitting element included in the fifth pixel, and is formed at positions facing the first light emitting element included in the second pixel, the second light emitting element included in the fourth pixel, and the third light emitting element included in the sixth pixel.

9. The electronic apparatus according to claim 8, further comprising seventh and eighth pixels arranged in the display panel, each of the seventh and eighth pixels including a fourth light emitting element configured to emit light of a fourth color, wherein the seventh and eighth pixels are disposed at positions overlapping the imaging element in planar view, and the reflective layer is not formed at a position facing the fourth light emitting element included in the seventh pixel, and is formed at a position facing the fourth light emitting element included in the eighth pixel.

10. The electronic apparatus according to claim 9, wherein the display panel includes a drive circuit, and the drive circuit is configured to:

when the imaging element does not operate, cause the first light emitting elements included in the first and second pixels, the second light emitting elements included in the third and fourth pixels, the third light emitting elements included in the fifth and sixth pixels, and the fourth light emitting elements included in the seventh and eighth pixels to emit light; and when the imaging element operates, cause the first light emitting element included in the first pixel, the second light emitting element included in the third pixel, the third light emitting element included in the fifth pixel, and the fourth light emitting element included in the seventh pixel not to emit light, and cause the first light emitting element included in the second pixel, the second light emitting element included in the fourth pixel, the third light emitting element included in the sixth pixel, and the fourth light emitting element included in the eighth pixel to emit light.

11. A display device comprising:

a display panel in which a first pixel including a first light emitting element configured to emit light of a first color, a second pixel including a second light emitting element configured to emit light of a second color, and a third pixel including a third light emitting element configured to emit light of a third color are arranged; and a drive circuit configured to drive the display panel, wherein the first to third pixels are disposed at positions overlapping an imaging element in planar view, the imaging element being configured to receive light via the display panel, and the display panel includes a reflective layer that is not formed at a position facing the first light emitting element, and is formed at positions facing the second and third light emitting elements.

12. A display device comprising:

a display panel in which first and second pixels each including a first light emitting element configured to emit light of a first color, third and fourth pixels each including a second light emitting element configured to emit light of a second color, and fifth and sixth pixels each including a third light emitting element configured to emit light of a third color are arranged; and a drive circuit configured to drive the display panel, wherein the first to sixth pixels are disposed at positions overlapping an imaging element in planar view, the imaging element being configured to receive light via the display panel, and the display panel includes a reflective layer that is not formed at positions facing the first light emitting element included in the first pixel, the second light emitting element included in the third pixel, and the third light emitting element included in the fifth pixel, and is formed at positions facing the first light emitting element included in the second pixel, the second light emitting element included in the fourth pixel, and the third light emitting element included in the sixth pixel.

* * * * *